(12) United States Patent
Heiskanen

(10) Patent No.: US 9,632,544 B2
(45) Date of Patent: Apr. 25, 2017

(54) APPARATUS FOR RECEIVING AT LEAST ONE INTEGRATED CIRCUIT CARD

(71) Applicant: Microsoft Technology Licensing, LLC, Redmond, WA (US)

(72) Inventor: Juuso Heiskanen, Kaarina (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 51 days.

(21) Appl. No.: 14/644,904

(22) Filed: Mar. 11, 2015

(65) Prior Publication Data

US 2016/0266619 A1  Sep. 15, 2016

(51) Int. Cl.
| | |
|---|---|
| *H05K 5/00* | (2006.01) |
| *G06F 1/16* | (2006.01) |
| *G06F 1/18* | (2006.01) |
| *H05K 5/02* | (2006.01) |

(52) U.S. Cl.
CPC .......... *G06F 1/185* (2013.01); *G06F 1/1656* (2013.01); *G06F 1/186* (2013.01); *H05K 5/0291* (2013.01)

(58) Field of Classification Search
CPC ........ G06F 1/185; G06F 1/186; G06F 1/1656; H05K 5/0295
USPC ................................ 361/679.31, 679.32, 754
See application file for complete search history.

(56) References Cited

U.S. PATENT DOCUMENTS

| | | | |
|---|---|---|---|
| 5,443,395 A | 8/1995 | Wang | |
| 5,720,311 A | 2/1998 | Lin et al. | |
| 6,370,362 B1 | 4/2002 | Hansen et al. | |
| 7,766,678 B1 * | 8/2010 | Abe | H05K 5/0295 439/159 |
| 8,414,094 B2 | 4/2013 | Chi et al. | |
| 8,432,682 B2 * | 4/2013 | Quan | G06K 13/0825 361/679.38 |
| 8,462,514 B2 * | 6/2013 | Myers | G06K 13/08 361/754 |
| 8,605,451 B2 * | 12/2013 | Tang | H04B 1/3816 361/679.31 |
| 8,614,897 B2 * | 12/2013 | Tang | G06K 13/08 361/752 |
| 8,767,381 B2 | 7/2014 | Shukla et al. | |

(Continued)

FOREIGN PATENT DOCUMENTS

| | | |
|---|---|---|
| CN | 1157037 C | 7/2004 |
| CN | 1183487 C | 1/2005 |

(Continued)

OTHER PUBLICATIONS

Gupta, Rahul, "Xolo 8X-1000 Powered by HIVE UI First Impressions: A Good Start", Published on: Aug. 7, 2014, Available at: http://www.91mobiles.com/blog/xolo-8x-1000-hive-ui-first-impressions.html.

(Continued)

*Primary Examiner* — Nidhi Thaker

(57) ABSTRACT

An apparatus is described. In an embodiment, the apparatus comprises a tray configured to carry at least one integrated circuit card; a handle connected to the tray in a slidable manner and having a shortened closed position and an extended open position with respect to the tray. Further, the apparatus comprises an ejector configured to eject the handle to its extended open position. In the extended open position, the handle extends away from the tray.

20 Claims, 11 Drawing Sheets

(56) References Cited

U.S. PATENT DOCUMENTS

| | | | |
|---|---|---|---|
| 8,913,396 B2* | 12/2014 | Chao | G06F 1/1656 |
| | | | 361/679.32 |
| 9,106,310 B2* | 8/2015 | Dondzik | H04B 1/3888 |
| 9,147,134 B2* | 9/2015 | Shimada | G06K 13/085 |
| 2007/0105446 A1 | 5/2007 | Lai et al. | |
| 2012/0295458 A1 | 11/2012 | Pauley et al. | |
| 2014/0104767 A1 | 4/2014 | Sutherland et al. | |
| 2014/0247568 A1* | 9/2014 | Lin | H04B 1/3818 |
| | | | 361/754 |

FOREIGN PATENT DOCUMENTS

| | | |
|---|---|---|
| CN | 202652298 U | 1/2013 |
| CN | 203574181 U | 4/2014 |

OTHER PUBLICATIONS

Mileschin, Stefan, "iOCEAN X8 octa-core Smartphone Review", Published on: Jun. 13, 2014, Available at: http://www.madshrimps.be/articles/article/1000611/iOCEAN-X8-octa-core-Smartphone-Review/4#axzz3Mhm7un1a.

Rosgani, "Review of Lenovo VIBE Z", Published on: Nov. 19, 2013, Available at: http://www.gizmochina.com/2013/11/19/review-of-lenovo-vibe-z-k910-unicom-3g-mobile-phone/.

"Nokia E7-00 RM-626 Service Manual Level 1&2", Published on: Jan. 1, 2010, Available at: http://www.altehandys.de/downloads/serman-no-e7-00.pdf.

"Nokia E7-00 User Guide", Published on: Jan. 1, 2011, Available at: http://nds1.webapps.microsoft.com/files/support/apac/phones/guides/Nokia_E7-00_Nokia_Belle_UG_en.pdf.

* cited by examiner

V-V

APPARATUS FOR RECEIVING AT LEAST ONE INTEGRATED CIRCUIT CARD

BACKGROUND

Many pieces of the existing electronic equipment that people use, for example for interacting with each other, for navigation, for identification, etc. may have a slot for an integrated circuit card, which is often called a smart card.

SUMMARY

This Summary is provided to introduce a selection of concepts in a simplified form that are further described below in the Detailed Description. This summary is not intended to identify key features or essential features of the claimed subject matter, nor is it intended to be used to limit the scope of the claimed subject matter.

An apparatus comprises a tray configured to carry at least one integrated circuit card, for example a smart card, and a handle connected to the tray in a slidable manner and having a shortened closed position and an extended open position with respect to the tray. Further, the apparatus comprises an ejector configured to eject the handle to its extended open position. In the extended open position the handle extends away from the tray.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present examples and is not intended to represent the only forms in which the present example may be constructed or utilized. However, the same or equivalent functions and sequences may be accomplished by different examples.

Mobile wireless devices, such as mobile phones, laptops, tablets, smart watches and other smart wearables or cars with an on-board navigational system may need an integrated circuit card. It is also possible to use an external smart card reader for reading an integrated circuit card.

Often an integrated circuit card or a smart card is any size of a Subscriber Identity Module card (SIM card), a memory card, an identity card or a card which is suitable for paying purchases. The cards may be of different sizes and may have different thicknesses. For example, the SIM card has been standardized and has four typical sizes according to the standards: full-size SIM 1st form factor (1FF), mini-SIM 2nd form-factor (2FF), micro-SIM 3rd form-factor (3FF), and nano-SIM 4th form-factor (4FF). Some pieces of electronic equipment using the integrated circuit card may also accept more than one integrated circuit card.

Figure 1A:
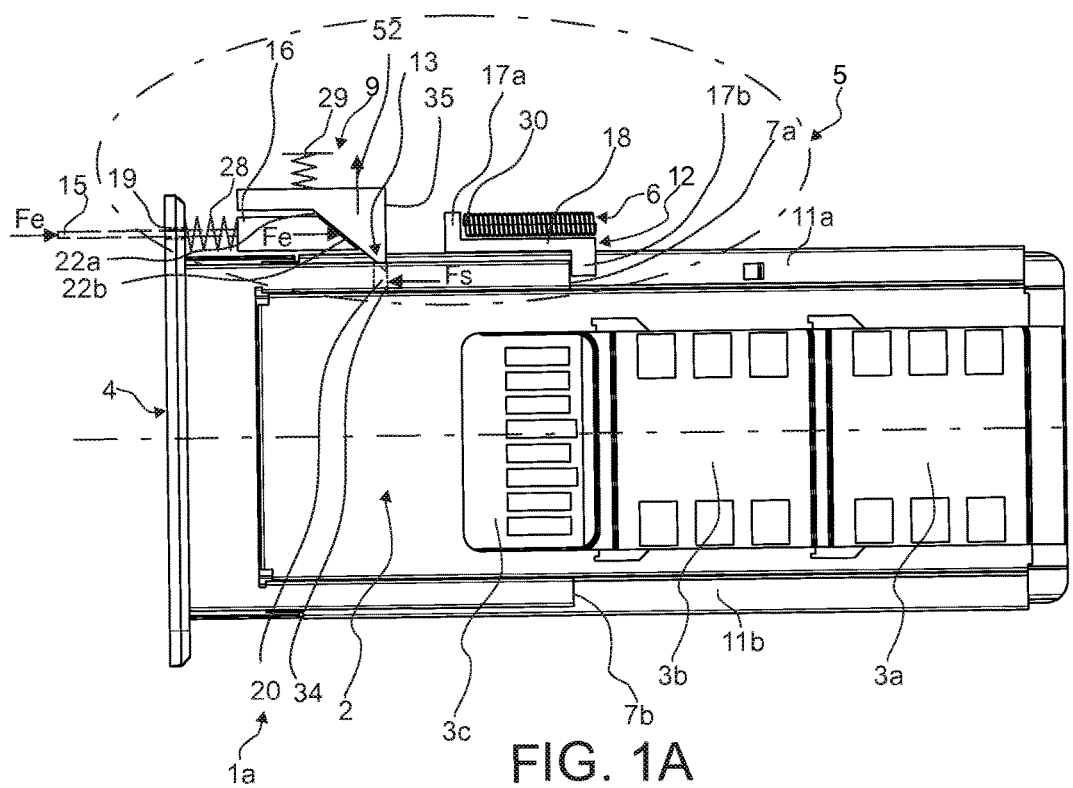
FIG. 1A is a schematical example illustration of an apparatus where a handle is in a shortened closed position.
Figure 1B:
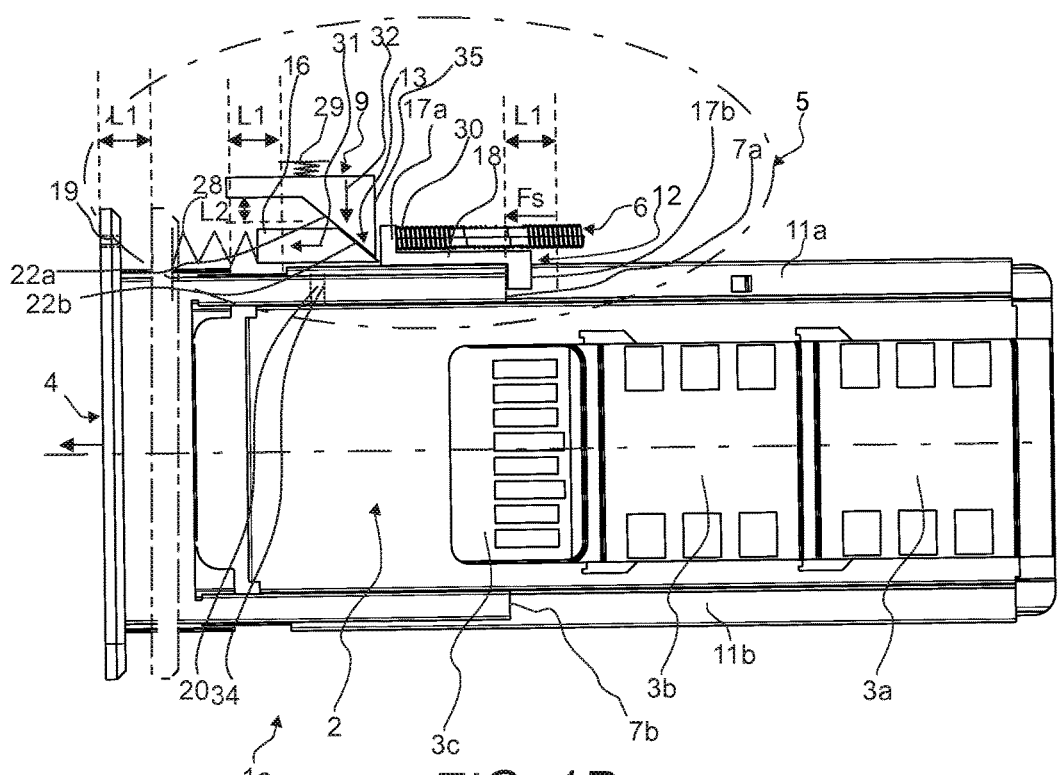
FIG. 1B is a schematical example illustration of an apparatus where a handle is in an extended open position.

FIG. 1A is a schematical example illustration of an apparatus 1a where a handle 4 is in a shortened closed position. FIG. 1A illustrates a cut-out view in order to show the structures that are hidden by other parts. In the following paragraphs, an abbreviated term "IC card" is used for an integrated circuit card. FIGS. 1A and 1B illustrate three IC cards 3a, 3b, 3c that are releasably mounted to the apparatus 1a. In the example illustration, a tray 2 of the apparatus 1a has the capability to receive two types of IC cards 3a, 3b, 3c. The first IC card 3a and the second IC card 3b may be, for example Subscriber Identity Module cards (SIM cards) and the third IC card 3c close to the handle 4 of the apparatus 1a may be a memory card, such as a Secure Digital card (SD card).

In one example, the tray 2 may be structured to receive a 4FF (fourth form factor) size SIM card. For example, the first IC card 3a and the second IC card 3b may be 4FF ($4^{th}$ form factor) size SIM cards. The 4FF SIM card may be manufactured out of a 2FF ($2^{nd}$ form factor) or 3FF ($3^{rd}$ form factor) SIM card by the user cutting the bigger 2FF/3FF card into a smaller 4FF card for example by using scissors. The thickness of a 2FF/3FF SIM card may be 0.76 mm, while a 4FF SIM card may have a thickness of 0.67 mm. This difference in thicknesses may cause a problem when this above mentioned "user-modified IC card" is inserted into the apparatus 1a, because the card may become jammed inside the apparatus 1a in such a way that it is hard or even impossible to remove it without breaking or dismantling some parts of the apparatus 1a or without using special tools. One way to solve this problem is to use a very strong spring, which, when released from its compressed state, pushes a card tray out of a device in which the card tray is utilized. The force needed for ejecting the jammed card may be very high and may require a high force coil spring. The high force coil spring may cause movement in the card tray reader, bending it and possibly creating open solder joints in the card reader, when it is manufactured. For example, in a SIM card reader, co-planarity is very important because good connection is needed between the card reader and an IC card.

The apparatus 1*a* illustrated in FIG. 1A comprises a tray 2 configured to carry at least one IC card 3*a*, 3*b*, 3*c*, such as the above mentioned SIM card or a memory card. The handle 4 is connected to the tray 2 in a slidable manner and has a shortened closed position and an extended open position with respect to the tray 2. The extended open position is illustrated in FIG. 1B. In the extended open position, the handle 4 extends away from the tray 2. The apparatus 1*a* further comprises an ejector 5 configured to eject the handle 4 to its extended open position. The ejector 5 may comprise a spring or a lever or it may be any other similar type of element or mechanism that is capable to eject the handle 4 away from the tray 2.

The handle 4 may comprise a first telescopic part 7*a* and a second telescopic part 7*b*, enabling the sliding of the handle 4 between the shortened closed position and the extended open position. When the handle 4 comprises two telescopic parts 7*a*, 7*b*, the structure of the handle 4 is more rigid. In another example, it may be possible to structure the handle 4 with just one, a bit larger telescopic part than what is illustrated in FIG. 1A, in the middle of the handle 4 (not illustrated). The handle 4 is connected to the tray 2 in a slidable manner via the telescopic parts 7*a*, 7*b*. The tray 2 comprises a first guide rail 11*a* and a second guide rail 11*b*, one for each telescopic part 7*a*, 7*b*. The guide rails 11*a*, 11*b* are structured in such a way that they are able to receive the telescopic parts 7*a*, 7*b*. The telescopic parts 7*a*, 7*b* are fixed to the handle 4, and the guide rails 11*a*, 11*b* are fixed to the tray 2, enabling the extension of the handle 4, when the telescopic parts 7*a*, 7*b* are slid on the guide rails 11*a*, 11*b*. At least one IC card 3*a*, 3*b*, 3*c* may be releasably mounted to the tray 2 between the first guide rail 11*a* and the second guide rail 11*b*.

The apparatus 1*a* may further comprise a locking mechanism 9 enabling locking of the handle 4 in the shortened closed position. Ejection of the handle 4 may be caused by an external opening tool 15, which is led through a through hole 19 in the handle 4 for applying an external force Fe to the locking mechanism 9, causing the unlocking of the locking mechanism 9. The external opening tool 15 is illustrated with a dash-dot line in FIG. 1A. The opening tool 15 can be inserted through the through hole 19 by the user to apply the external force Fe to the locking mechanism 9 with the opening tool 15. The locking mechanism 9 may comprise a wedge surface 22*a* and a second wedge surface 22*b*. The locking mechanism 9 may further comprise a latch 13 and a wedge 16. As disclosed in FIGS. 1A and 1B, the wedge 16 comprises the first wedge surface 22*a* and the latch 13 comprises the second wedge surface 22*b*. When the external force Fe is applied to the wedge 16, the first wedge surface 22*a* moves towards the second wedge surface 22*b* and effect the moving of the second wedge surface 22*b*. The latch 13 is moved out of an opening 20 of the first telescopic part 7*a* when the external force Fe is applied by the user to the wedge 16 and further to the first wedge surface 22*a* and the second wedge surface 22*b* with the opening tool 15, thus causing unlocking of the locking mechanism 9. The opening 20 is illustrated with a dashed line in FIG. 1A. The external force Fe applied by the user to the wedge 16 causes the latch 13 to move in a direction described with an arrow 52. The latch 13 moves away from the opening 20 in the vertical direction because the wedge surfaces 22*a*, 22*b* are angled. The angle of the wedge surfaces 22*a*, 22*b* may be, for example 45 degrees. The latch 13 is locked, because a first side 34 of the opening 20 is pressed towards a shoulder 35 of the latch 13 by a spring force Fs of a spring 6. A second return spring 29 may be connected to the latch 13 for returning the latch 13 to its original position. The second return spring 29 may have such a spring force that it keeps the locking mechanism 9 in a locked state (i.e. the handle 4 being in the closed position as illustrated in FIG. 1A) when no external force is applied to the wedge 16. When the latch 13 is released from a locked position, the handle 4 moves into the extended open position, as illustrated in FIG. 1B.

FIG. 1B is a schematical example illustration of the apparatus 1*a* where a handle 4 is in an extended open position. The initial position of the handle 4 is marked with dash-dot lines. The ejector 5 comprises the spring 6, which, when released from its compressed state, enables the ejection of the handle 4 to its extended open position. This function can be arranged with the aid of a pushing member 12 of the ejector 5. A first end 30 of the spring 6 is connected to a first shoulder 17*a* of the pushing member 12. The spring 6 causes the pushing member 12 to push the first telescopic part 7*a* with a second shoulder 17*b* of the pushing member 12. An arm 18 is structured between the first shoulder 17*a* and the second shoulder 17*b*. The spring 6 moves along the arm 18. The spring 6, when being released from its compressed state, moves its first end 30 to the left in the direction of an arrow of the spring force Fs and at the same time moves the pushing member 12. The first telescopic part 7*a* moves the handle 4 to the extended open position with the aid of the spring force Fs of the spring 6. The release of the spring 6 is possible, because the latch 13 has been moved out of the opening 20. The spring 6, the pushing member 12 and the handle 4 with the telescopic parts 7*a*, 7*b* move a length L1 as illustrated with dashed lines in FIG. 1B. As only the handle 4 is ejected and not the tray 4 with the IC cards 3*a*, 3*b*, 3*c*, it is now easy for the user to manually grab the handle 4 and pull out the tray 2 with the IC cards 3*a*, 3*b*, 3*c*. With this solution, there will not be any risk of jamming the apparatus 1*a* with the IC cards 3*a*, 3*b*, 3*c*. For ejecting only the handle 4, a weaker spring is required compared to a solution where the whole tray with the IC cards is ejected. With the solution presented above, there is no need to size the spring 6 to take into account the jamming possibility.

After the ejection of the handle 4, the wedge 16 is returned to its initial position as illustrated in FIG. 1A with a first return spring 28, when the user has stopped applying the external force Fe to the opening tool 15. The first return spring 28 may be, for example connected to a cover of an electronic device comprising the apparatus 1*a*. The direction of the movement when the wedge 16 is starting to move to its initial position is illustrated with an arrow 31. The latch 13 is returned to its initial position by a second return spring 29, and its movement is illustrated with an arrow 32. The length that the latch 13 moves in the vertical direction is illustrated with a dashed line and indicated as a vertical wedging length L2. Another solution is to return the wedge 6 using only the second return spring 29. In this solution the second return spring 29 pushes the wedge 16 to its initial position when the user removes the external force Fe from the opening tool 15. In this solution the first return spring 28 is not needed. Wedge surfaces 22*a*, 22*b* are fixed together in such a way that the latch 13 pulls back the wedge while returning to its original position with the second return spring 29. Further, another solution is to return the latch 13 using only the first return spring 28. In this solution the first return spring 28 pulls the wedge 16 to its initial position while simultaneously moving the latch 13 when the user removes the external force Fe from the opening tool 15. In this solution the second return spring 29 is not needed. Wedge surfaces 22a, 22b are fixed together in such a way that the wedge 16 is moving back the latch 13 while returning to its original position with the first return spring 28. The returning principle of the latch 13 and the wedge 16 to their initial positions presented in FIGS. 1A and 1B with the return springs 28, 29 are only one example and there may also be other solutions to implement this function.

Figure 1C:
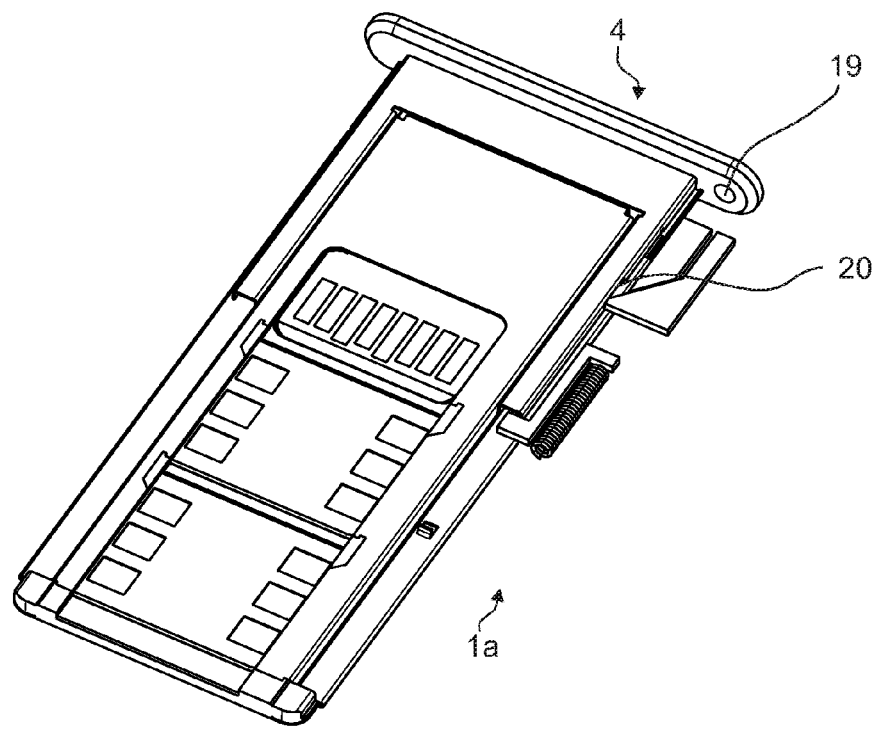
FIG. 1C is a schematical example illustration of an apparatus where a handle is in a shortened closed position.
Figure 7A:
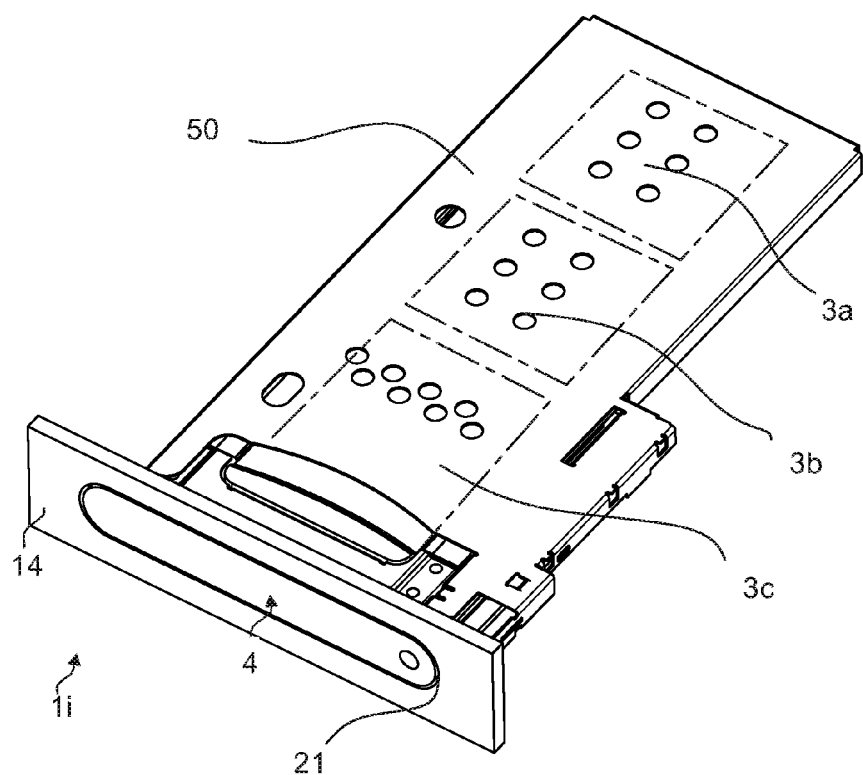
FIG. 7A is a schematical example illustration of an apparatus where a handle is in a shortened closed position.
Figure 7B:
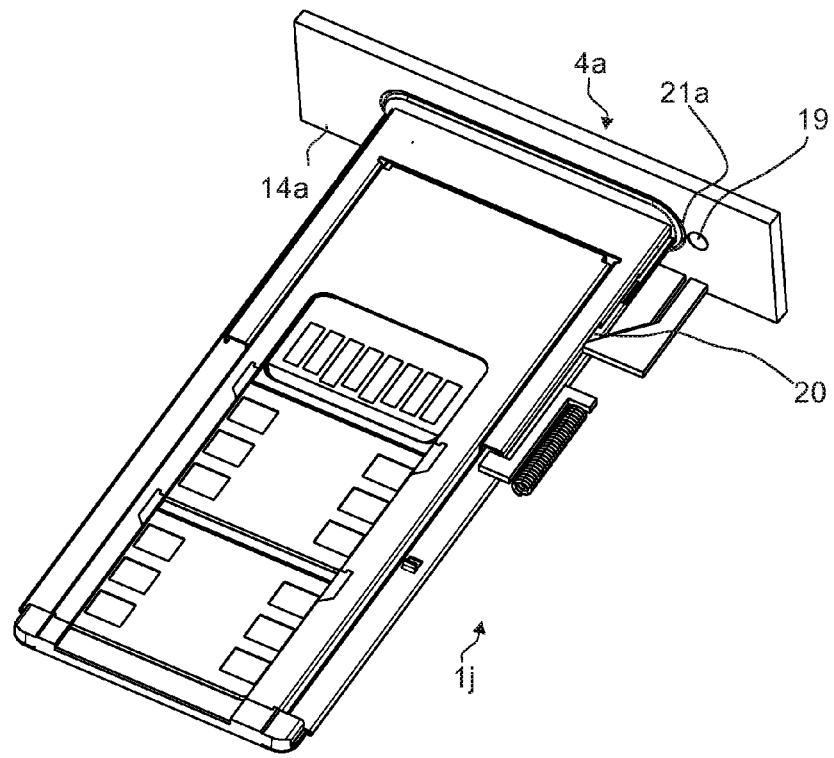
FIG. 7B is a schematical example illustration of an apparatus where a handle is in a shortened closed position.

FIG. 1C is a schematical example illustration of the apparatus 1a where a handle 4 is in the shortened closed position. For simplicity, some details are not illustrated as they are already illustrated above in FIGS. 1A and 1B. FIGS. 7A and 7B disclose the through hole 19 and the opening 20 and their position in the apparatus 1a in a more detail.

Figure 1D:
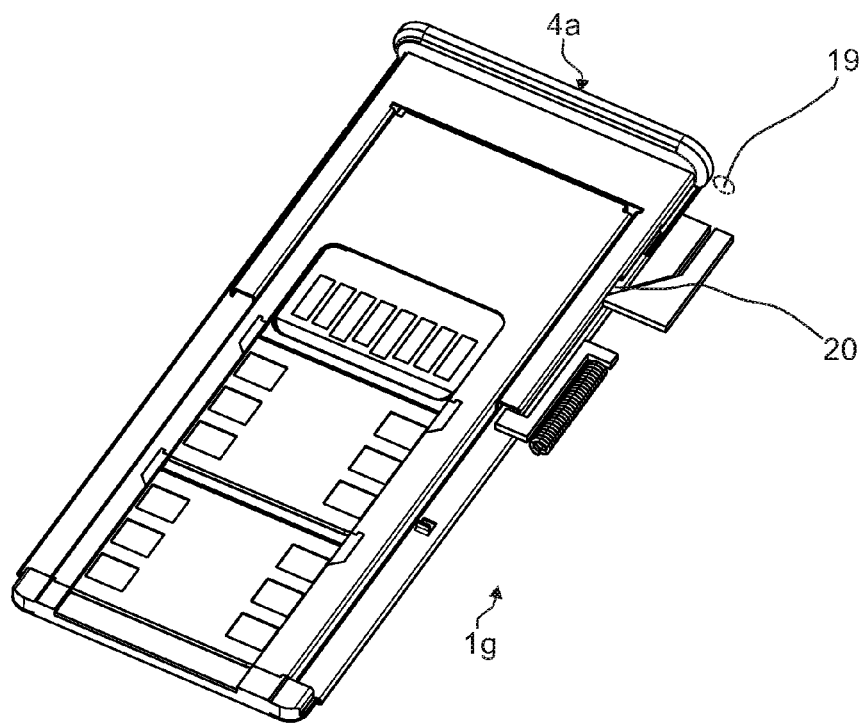
FIG. 1D is a schematical example illustration of an apparatus where a handle is in a shortened closed position.

FIG. 1D is a schematical example illustration of an apparatus 1g where a handle 4a is in a shortened closed position. FIG. 1D is similar to FIG. 1C with the exception that the through hole 19 is located outside the handle 4a. For example, the through hole 19 is located in a cover of an electronic device comprising the apparatus 1g. Further, the width of the handle 4a may be reduced compared to the width of the handle 4 disclosed in FIG. 1C.

Figure 2A:
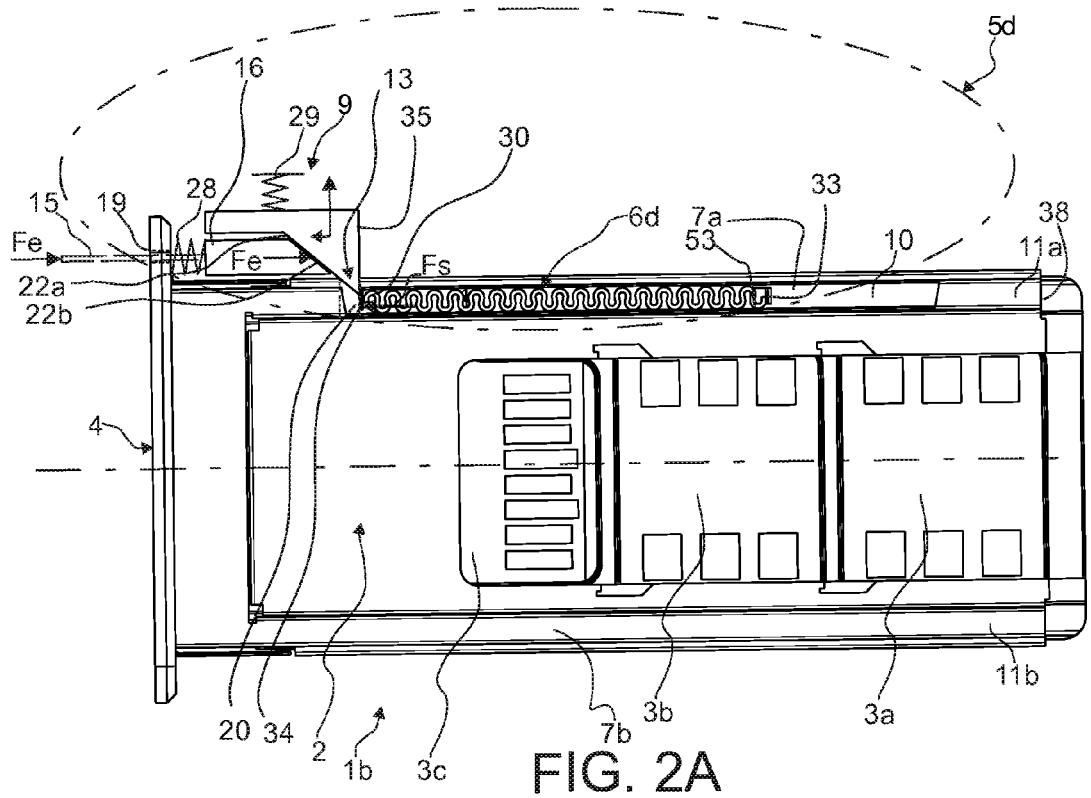
FIG. 2A is a schematical example illustration of an apparatus where a handle is in a shortened closed position.
Figure 2B:
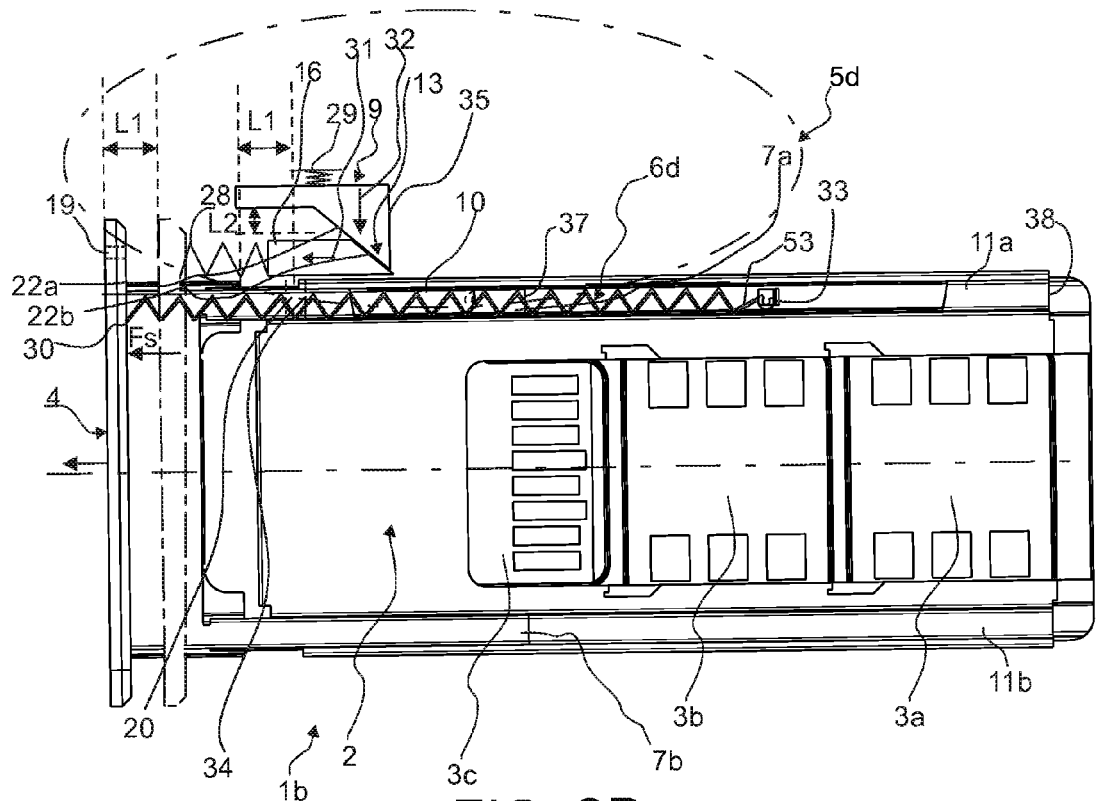
FIG. 2B is a schematical example illustration of an apparatus where a handle is in an extended open position.

FIG. 2A is a schematical example illustration of an apparatus 1b where a handle 4 is in a shortened closed position. FIG. 2B is a schematical example illustration of the apparatus 1b where the handle 4 is in an extended open position. The initial position of the handle 4 is marked with dash-dot lines in FIG. 2B. In the example of FIGS. 2A and 2B, some of the parts are presented as a cut-out view in order to show the structures that are hidden by other parts. FIGS. 2A and 2B are similar to FIGS. 1A and 1B with the exception that an ejector 5d does not comprise the pushing member 12. Another difference with FIGS. 1A and 1B is that the spring 6 is located inside the first telescopic part 7a. In the example of FIGS. 2A and 2B the first telescopic part 7a comprises a hollow profile 10 and the ejector 5d comprises a spring 6d. One example of the hollow profile 10 is disclosed later in FIG. 3B. The spring 6d is located inside the hollow profile 10. The spring 6d causes the ejection of the handle 4 in a slidable manner, when the spring 6d is released from its compressed state and when the first end 30 of the spring 6d is being moved against the handle 4 inside the hollow profile 10, while the second end 53 is affixed to the tray 2. The second end 53 of the spring 6d is fixed to an unmoved position with a spring stopper 33, which may be structured to the first guide rail 11a of the tray 2. The spring 6d is located between a shoulder 35 and the spring stopper 33 in the closed shortened position. The release of the spring 6d from its compressed state may be carried out similarly as illustrated in FIG. 1A by releasing the latch 13 of the locking mechanism 9 from the opening 20. The release of the spring 6d from its compressed state causes the first end 30 of the spring 6d to push the handle 4 to the extended open position. When the spring stopper 33 is used, the spring 6d can be made shorter compared to a solution where the spring 6d continues all the way from the handle 4 to an inner end 38 of the first guide 11a. In another example, the spring 6d may extend all the way from the handle 4 to the inner end 38 when a longer spring is used (not illustrated in FIGS. 2A and 2B).

Figure 3A:
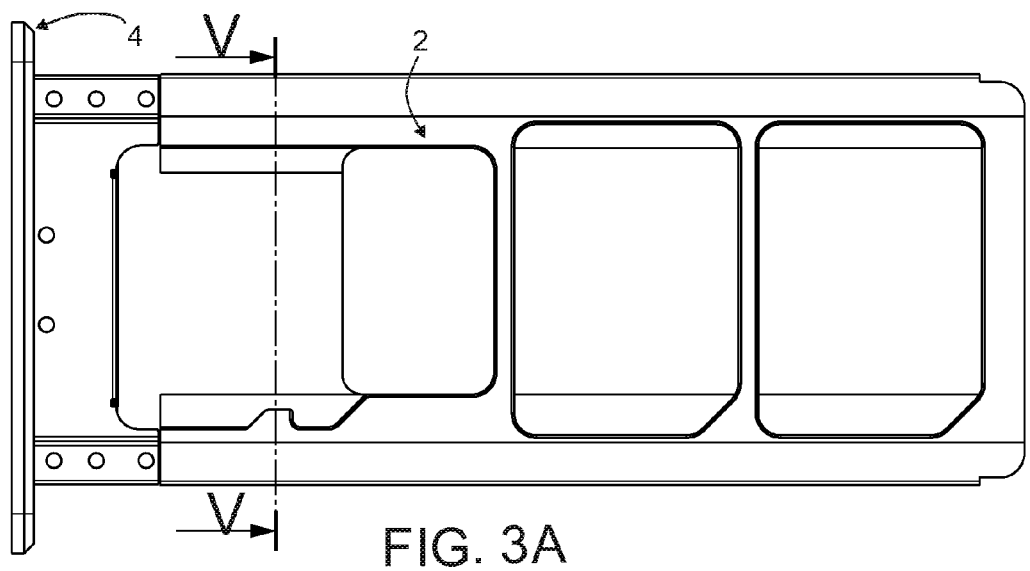
FIG. 3A is a schematical example illustration of a tray and a handle.
Figure 3B:
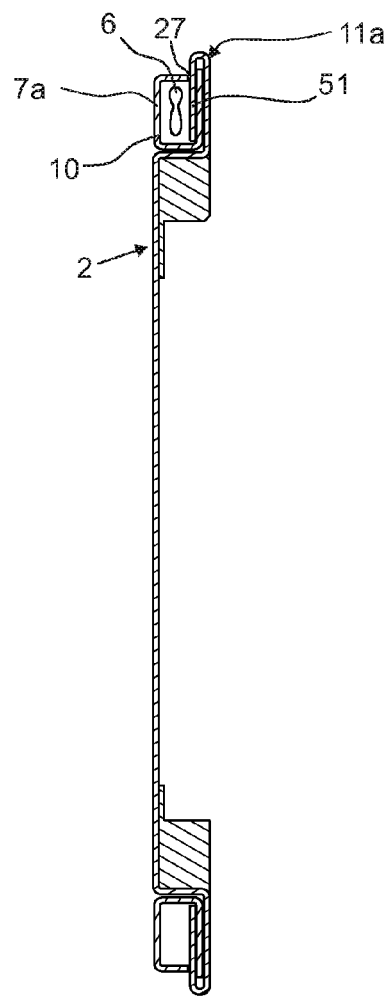
FIG. 3B is a schematical example illustration of the connection of a handle to a tray.

FIG. 3A is a schematical example illustration of a tray 2 and a handle 4. FIG. 3B is a schematical example illustration of the connection of the handle 4 to the tray 2. FIG. 3A illustrates the position of the cut-out and FIG. 3B illustrates a cut-out V-V. FIG. 3B discloses that the spring 6 is located inside the hollow profile 10 of the first telescopic part 7a. The first guide rail 11a is structured to be substantially U-shaped in order to guide the first telescopic part 7a. Naturally, the second telescopic part 7b and second guide rail 11b may be similar to the first telescopic part 7a and the first guide rail 11a. The longitudinal part 51 of the U-shaped structure is arranged inside the hollow profile 10 via a guide opening 27.

Figure 4A:
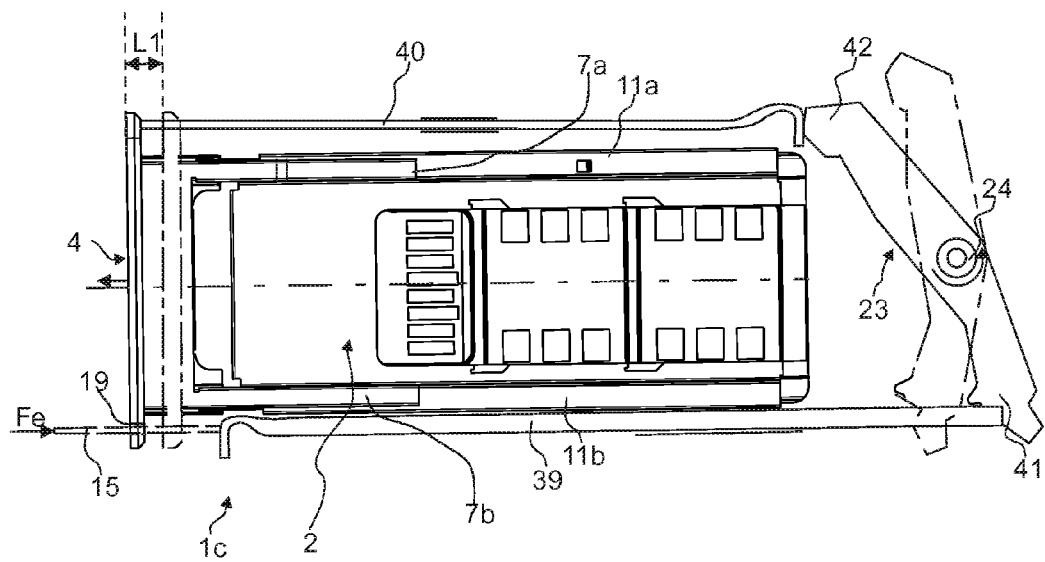
FIG. 4A is a schematical example illustration of an apparatus where a handle is in an extended open position.

FIG. 4A is a schematical example illustration of an apparatus 1c where a handle 4 is in an extended open position. The initial position of the handle 4 is marked with dash-dot lines. The example disclosed in FIG. 4A differs from the example disclosed in FIG. 1B that in FIG. 4A the ejection of the handle 4 is carried out with a lever 23. For simplicity, the locking mechanism is not separately illustrated in FIG. 4A, and a similar locking mechanism may be arranged than was disclosed in FIGS. 1A and 1B.

The apparatus 1c comprises at least one lever 23. The lever 23 comprises at least one pivotal connection 24, such as a bearing or any other type of a rotatable joint, enabling the pivoting of the lever 23 causing the sliding of the handle 4 to the extended open position. The lever 23 is pivoted around the at least one pivotal connection 24, when the external force Fe pushes the lever 23. The opening tool 15 is led through the opening by the user. The external force Fe may be applied with the opening tool 15. The external force Fe affects to the lever via a second pushing member 39. The second pushing member 39 is pushing a first portion 41 of the lever 23, causing the lever 23 to pivot around the at least one pivotal connection 24. A second portion 42 of the lever 23 pushes a third pushing member 40, which further pushes the handle 4 to the extended open position. An initial position of the lever 23 is illustrated with dash-dot lines in FIG. 4A.

Figure 4B:
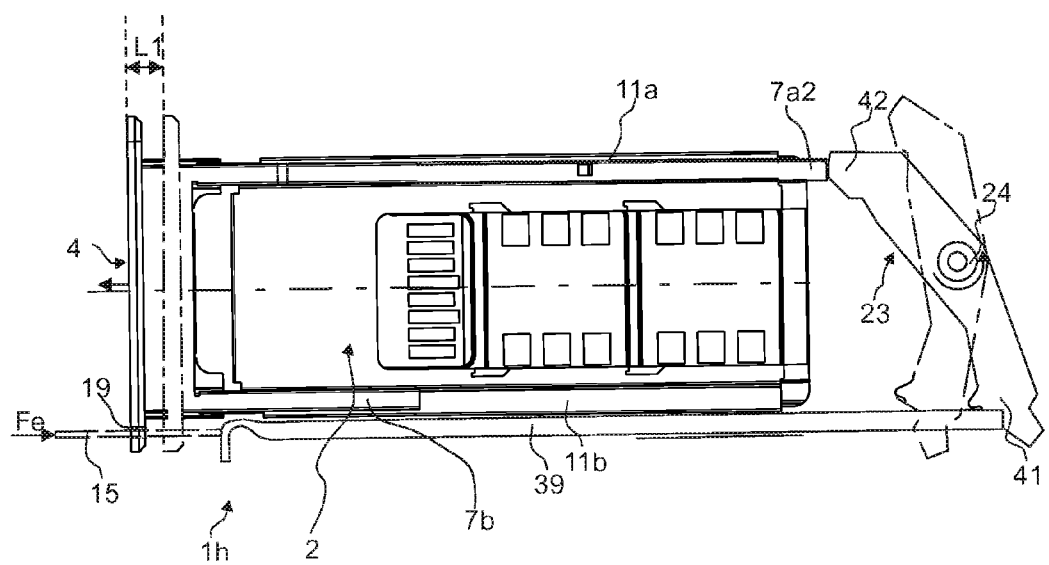
FIG. 4B is a schematical example illustration of an apparatus where a handle is in an extended open position.

FIG. 4B is a schematical example illustration of an apparatus 1h where a handle 4 is in an extended open position. FIG. 4B is similar to FIG. 4A with the exception that the third pushing member 40 is not needed. The first telescopic part 7a2 extends outside the tray 2 up to the second portion 42 of the lever 23. The second portion 42 of the lever 23 pushes the extended end of the first telescope part 7a2 pushing only the handle 4 away from the tray.

Figure 5:
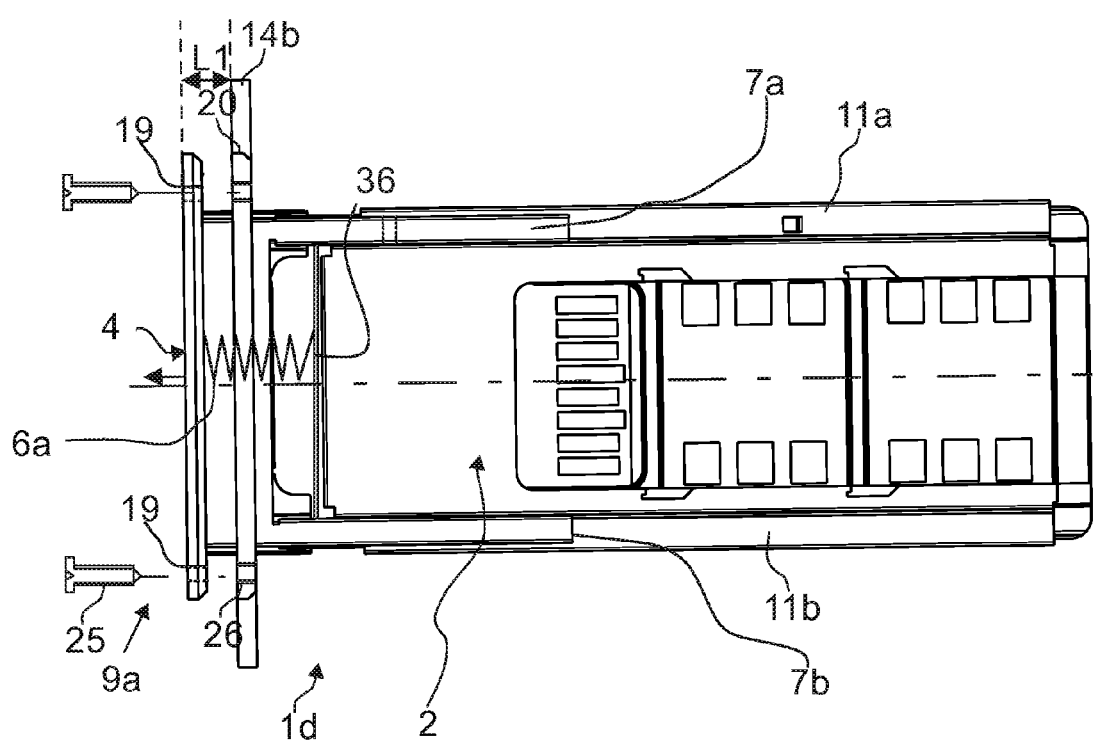
FIG. 5 is a schematical example illustration of an apparatus where a handle is in an extended open position.

FIG. 5 is a schematical example illustration of an apparatus 1d where the handle 4 is in an extended open position. In this solution, a spring 6a is placed between a spring stopper 36 of the tray 2 and the handle 4. The apparatus 1d is equipped with a locking mechanism 9a. The locking mechanism 9a comprises at least one screw 25. The spring 6a is positioned between the tray 2 and the handle 4 in such a way that the handle 4 is ejected to the extended open position, when the spring 6a is released from its compressed state. The release of the spring 6a may be carried out by unscrewing the at least one screw 25 from one or more threads 26 in a cover 14b. In another example, it is possible to equip the apparatus 1d with the same locking mechanism 9 as illustrated in FIG. 1A.

Figure 6:
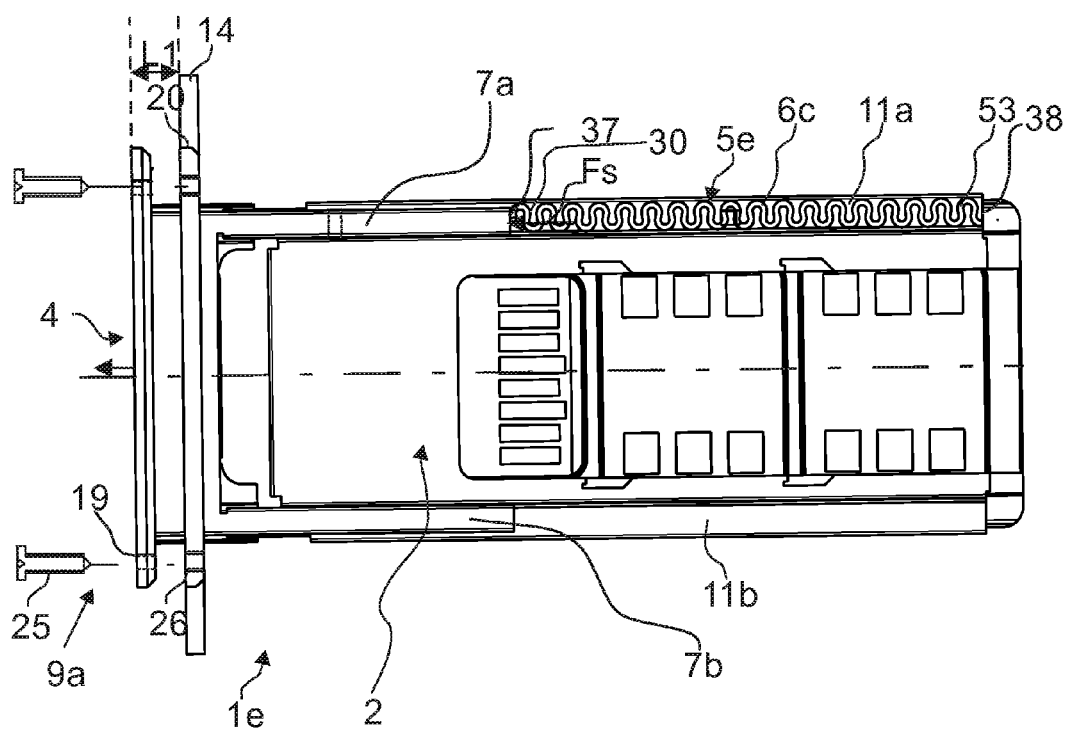
FIG. 6 is a schematical example illustration of an apparatus where a handle is an extended open position.

FIG. 6 is a schematical example illustration of an apparatus 1e where a handle is in an extended open position. The apparatus 1e is similar to the one illustrated in FIG. 5 with the exception that a spring 6c is located between the first inner end 37 of the first telescopic part 7a and the second inner end 38 of the first guide 11a. The first telescopic part 7a comprises the first inner end 37 and the ejector 5e comprises the spring 6c, which is located inside the first guide rail 11a. The spring 6c causes the ejection of the handle 4 in a slidable manner to the extended open position, when the spring 6c is released from its compressed state and when the first end 30 of the spring 6c is being moved against the first inner end 37 inside the tray 2, while the second end 53 of the spring 6c remains affixed to the second inner end 38.

The ejection of the handle 4 may be carried out similarly as in the above solutions by unscrewing the at least one screw 25 as illustrated in FIG. 6 or unlocking the locking mechanism 9 as illustrated in FIG. 1A.

FIG. 7A is a schematical example illustration of an apparatus 1i, where a handle is in the shortened closed position. FIG. 7A may comprise any of the apparatuses 1a-1e, 1g and 1h disclosed above. The apparatus 1i has a cover 14 for holding the at least one releasable IC card 3a, 3b, 3c inside the cover 14. FIG. 7A illustrates only a small portion of the cover 14 of an electronic device. In the extended open position, the handle 4 extends away from the tray 2 and extends outside the cover 14. The tray 2 with the at least one IC card 3a, 3b, 3c remains in an unmoved position inside the cover 14, when the handle 4 extends to the extended open position. The cover 14 comprises an opening 21 for inserting or removing the tray 2 with the at least one IC card 3a, 3b, 3c. The handle 4 is structured to fit in the opening 21 in the shortened closed position. When the handle 4 is ejected, the handle 4 is extended away from the opening 21 until the position of the at least one stopper is reached. The apparatus 1i may comprise a support plate 50, which supports the components inside the apparatus 1i.

FIG. 7B is a schematical example illustration of an apparatus 1j where a handle 4a is in a shortened closed position. FIG. 7B may comprise any of the apparatuses 1a-1e, 1g and 1h disclosed earlier. FIG. 7B is illustrated without the support plate 50 as it is already illustrated in FIG. 7A. FIG. 7B is similar to FIG. 7A with the exception that the through hole 19 is located in a cover 14a. In this solution the width of the handle 4a and the opening 21a may be structured smaller than the width of the handle 4 and the opening 21 in FIG. 7A.

Figure 8A:
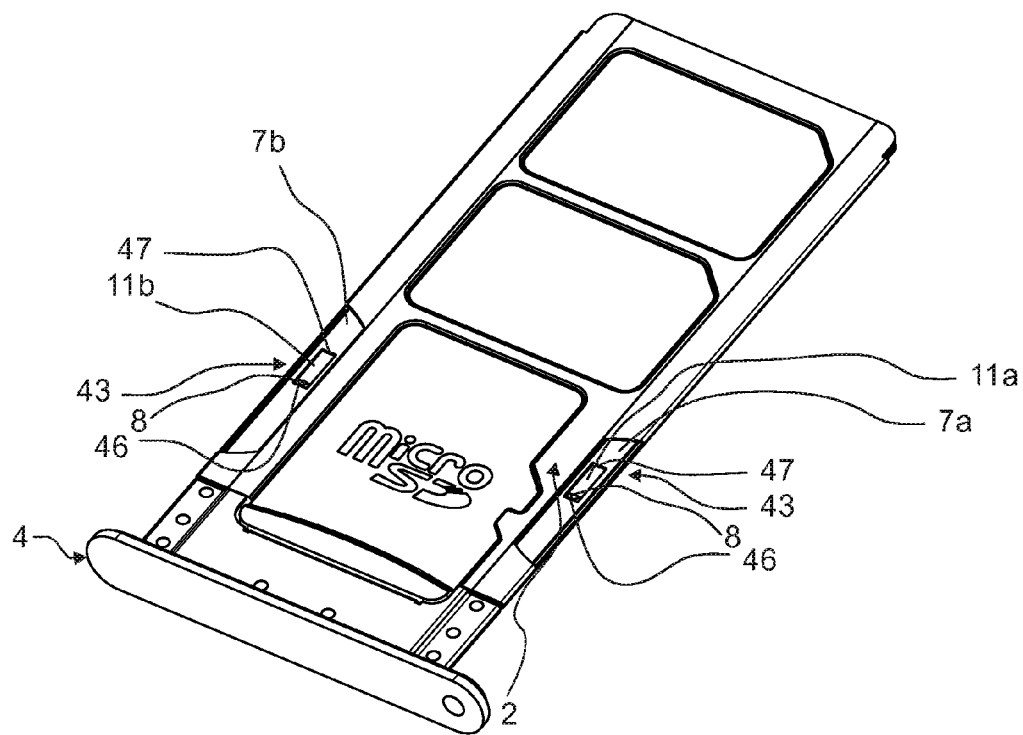
FIG. 8A is a schematical example illustration of a stopper where the handle is in a closed shortened position.
Figure 8B:
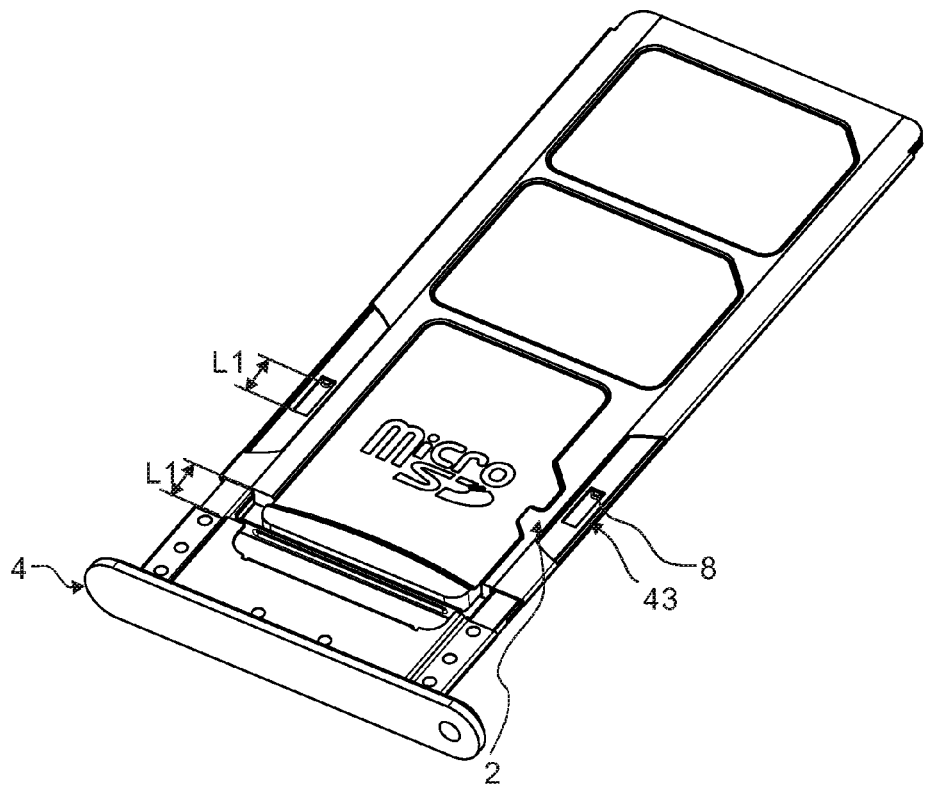
FIG. 8B is a schematical example illustration of a stopper where the handle is in an extended open position.

FIG. 8A is a schematical example illustration of a stopper 8, where the handle 4 is in a shortened closed position. FIG. 8B is a schematical example illustration of the stopper 8 where the handle 4 is in an extended open position. A opening 43 is structured to at least one of the telescopic parts 7a, 7b. In the example illustrated in FIGS. 8A and 8B, the opening 43 is structured to both of the telescopic parts 7a, 7b. In this example, the stopper 8 is structured to both of the guide rails 11a, 11b. When the handle 4 is moved also the opening 43 moves with the handle 4. The opening 43 can be moved to the position of the stopper 8. At the shortened closed position a first end 46 of the opening 43 is against the stopper 8. When the handle 4 is being moved towards the extended open position, a second end 46 of the opening 43 moves towards the stopper, which is in an unmoved position. The distance that the opening 43 moves with the telescopic member 7a and with the handle 4 is naturally the same as a length L1 disclosed in FIG. 8B. When the user pulls the handle 4 into the extended open position, the stopper 8 and the opening 43 prevent the handle 4 from being detached from the tray 2. The stopper 8 stops the handle 4 into the extended open position. The stopper 8 and the opening 43 may be implemented to all of the above illustrations. In this example stopper 8 is located in the guide rails 11a and 11b and the opening 43 is located in the telescopic parts 7a, 7b. Another solution is to structure the stopper 8 in the telescopic parts 7a, 7b and structure the opening 43 in the guide rails 11a, 11b. In this solution the stopper 8 moves up to the position of the opening 43.

Figure 8C:
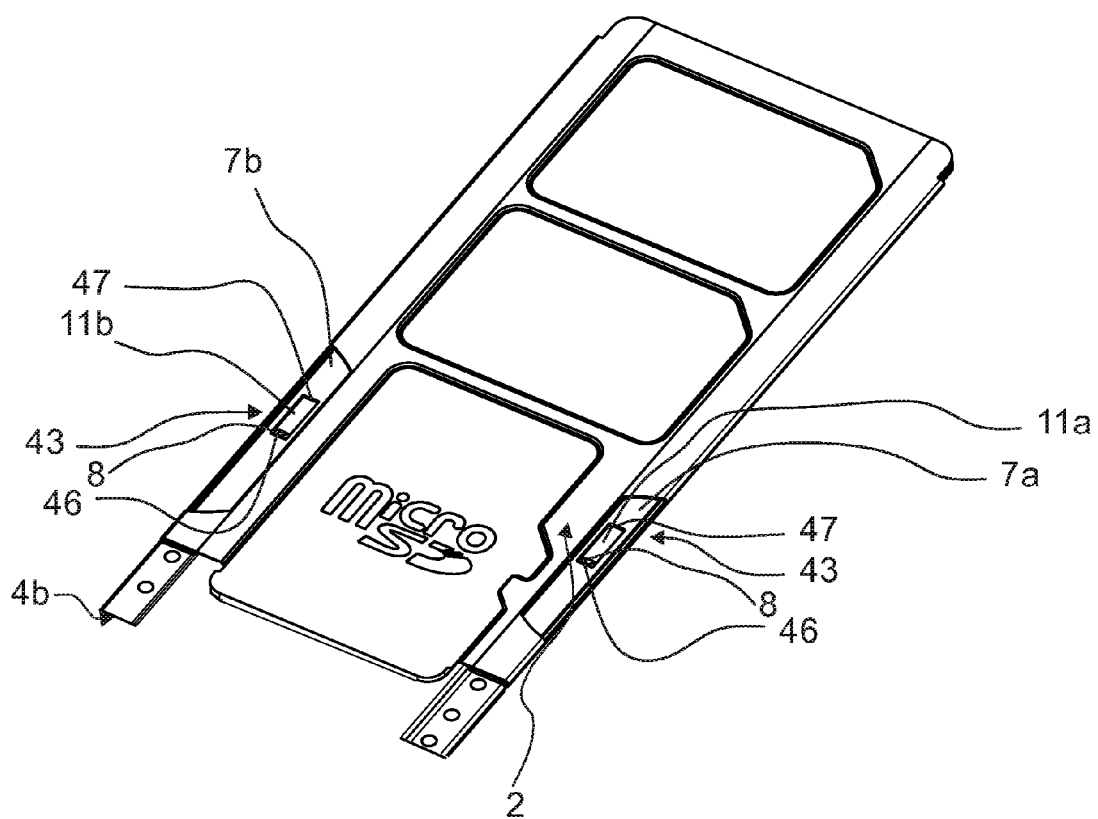
FIG. 8C is a schematical example illustration of a stopper where the handle without a front part is in a closed shortened position.

FIG. 8C is a schematical example illustration of a stopper 8 where the handle 4b is in a closed shortened position. FIG. 8C is similar to FIG. 8A with the exception that the handle 4b does not have a front part. The front part is the part where the user grabs, when the handle ejects and the user wants to pull out the tray 2. The front part may be installed to the handle 4b later, for example when an apparatus, for example, an electronic apparatus is assembled. Similarly, in FIGS. 1-7 the handle 4 of the apparatus may not necessarily comprise the front part and the front part may be installed at a later stage.

Figure 9:
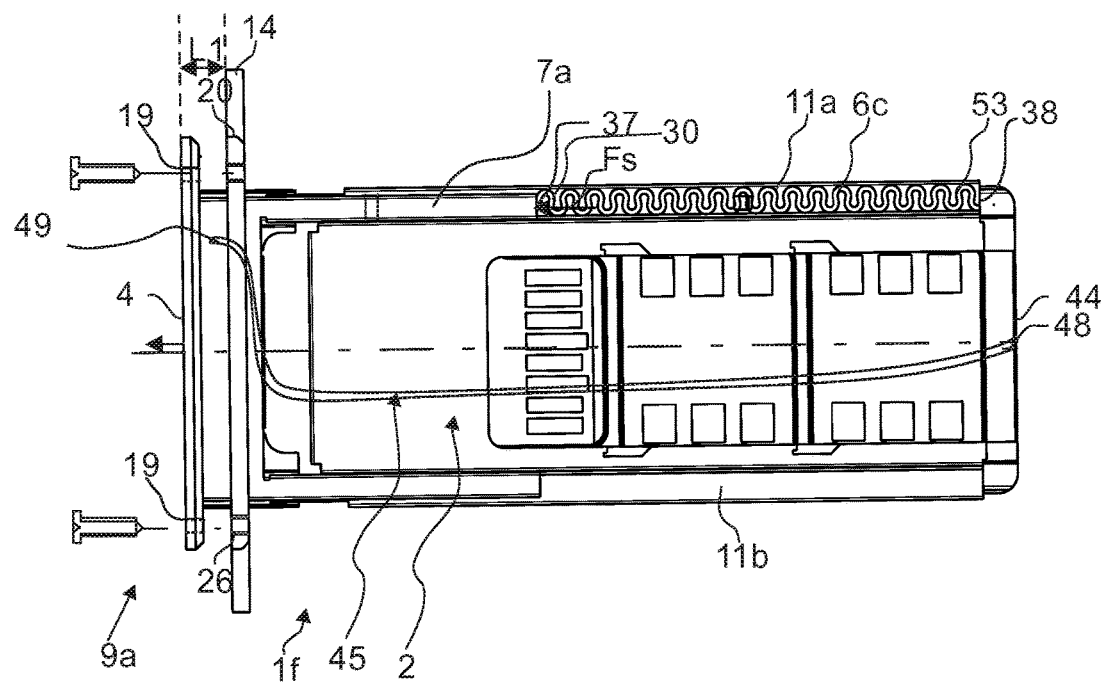
FIG. 9 is a schematical example illustration of an apparatus where a handle is in an extended open position.

FIG. 9 is a schematical example illustration of an apparatus 1f where a handle 4 is in an extended open position. The apparatus 1f is similar to the one illustrated in FIG. 6 with the exception that no stopper 8 and third opening 43 disclosed in FIGS. 8A and 8B are needed. When the handle 4 is ejected, the tray 2 with the at least one IC card 3a, 3b, 3c can be pulled out with the aid of a pulling element 45. This pulling element 45 may be a string or a flexible member which is inside the cover 14 when the handle 4 is in the shortened closed position but may be taken out when the handle 4 is ejected. When the apparatus 1f is not equipped with the stopper 8, the handle 4 becomes completely detached. The tray 2 can be removed by using the pulling element 45. The pulling element 45 is connected from an inner end 48 to an inner tray end 44. By pulling the pulling element 45, such as a string, from the outer end 49, the tray 2 can be pulled out manually by the user.

In one or more of the above examples the handle of the apparatus 1a, 1b, 1c, 1d, 1e, 1f, 1g or 1h may be ejected in such a way that a user may grab the handle and pull out the tray out from the apparatus. If the card tray carries an IC card or IC cards, they may be easily and reliably removed from the apparatus, and the risk of getting the apparatus 1a, 1b, 1c, 1d, 1e, 1f, 1g or 1h jammed is reduced. Even if the user inserts a thicker IC card to the card tray, the tray with the IC card can be easily removed.

Further, the apparatus 1a, 1b, 1c, 1d, 1e, 1f, 1g or 1h has a simple and reliable structure. If a coil spring is used, there is no need to use a strong coil spring in the apparatus in order remove an IC card. With the solution disclosed in the above examples, the ejector needs to push out the handle or the telescope part only, and this needs less force than pushing a jammed card or pushing a card tray. This also means that the spring force Fs can be kept low because the friction to be overcome is only the friction between the handle sliding with respect to the tray.

In some existing solutions the user may need to apply a considerable amount of force in order to eject an IC card. For example, the user may need to press a pin tool towards a table in order to apply enough power to eject an IC card. The solution disclosed in at least some of the examples above is designed to be user friendly by avoiding jamming issues. Also a better manufacturing result may be achieved compared, for example, to the solution with a strong coil spring. Further, possible co-planarity problems may be avoided.

The apparatus 1a, 1b, 1c, 1d, 1e, 1f, 1g or 1h disclosed in the examples above is useful in a solution where the apparatus 1a, 1b, 1c, 1d, 1e, 1f, 1g, 1h is used as card tray module for an electronic communication device, such as a smart phone or a tablet or a smart wearable. The apparatus 1a, 1b, 1c, 1d, 1e, 1f, 1g, 1h is particularly useful when the electronic communication device utilizes at least two IC cards 3a, 3b, 3c. The IC card 3a, 3b, 3c may be a subscriber identity module card (SIM card), a full-size SIM 1st form factor (IFF) card, a mini-SIM 2nd form factor (2FF) card, a micro-SIM 3rd form-factor (3FF) card, a nano-SIM 4th form-factor (4FF) card, a secure digital card (SD card), a mini secure digital card (miniSD card), a micro secure digital card (microSD card), a memory card, a storage card, and an expanded external memory card.

Although FIGS. 1A-7B and 9 describe the apparatus 1*a*, 1*b*, 1*c*, 1*d*, 1*e*, 1*f*, 1*g*, 1*h*, 1*i*, 1*j* disclosed with the manually operating locking mechanism 9, 9*a*, as known to those skilled in the art, the apparatus 1*a*, 1*b*, 1*c*, 1*d*, 1*e*, 1*f*, 1*g*, 1*h*, 1*i*, 1*j* may comprise other types of locking mechanisms additionally or alternatively. For example, the unlocking of a locking mechanism may be carried out with an automatic unlocking mechanism, where the user pushes a button for unlocking and ejecting the handle.

An embodiment of an apparatus comprises a tray configured to carry at least one integrated circuit card; a handle connected to the tray in a slidable manner and having a shortened closed position and an extended open position with respect to the tray; and an ejector configured to eject the handle to its extended open position, wherein, in the extended open position, the handle extends away from the tray.

In one example, the ejector comprises a spring, which when released, causes the ejection of the handle to its extended open position.

In one example, the spring is positioned between the tray and the handle in such a way that the handle is ejected to the extended open position, when the spring is released from its compressed state.

In one example, the apparatus is structured to releasable receive at least one of a subscriber identity module card, a secure digital card, a memory card, a storage card, and an expanded external memory card.

In one example, the handle comprises at least one telescopic part enabling sliding of the handle between the shortened closed position and the extended open position.

In one example, the tray comprises at least one guide rail, wherein the at least one guide rail is structured to receive the at least one telescopic part.

In one example, the at least one guide rail comprises a first guide rail and a second guide rail at a distance from one another, wherein the tray is structured to receive the at least one integrated circuit card between the first guide rail and the second guide rail.

In one example, the ejector comprises a spring and a pushing member, wherein the spring causes the pushing member to push the at least one telescopic part, when the spring is released from its compressed state, enabling the handle to move to the extended open position.

In one example, the at least one telescopic part comprises a hollow profile and the ejector comprises a spring located inside the hollow profile, wherein the spring causes the ejection of the handle in a slidable manner to the extended open position, when the spring is released from its compressed state and when a first end of the spring is being moved against the handle inside the hollow profile, while the second end of the spring remains affixed to the tray.

In one example, the at least one telescopic part comprises a first inner end and the ejector comprises a spring, being at least partially located inside the at least one guide rail, wherein the spring causes the ejection of the handle in a slidable manner to the extended open position, when the spring is released from its compressed state and when the first end of the spring is being moved against the first inner end inside the tray, while the second end of the spring remains affixed to the tray.

In one example, the apparatus comprises at least one lever, wherein the lever comprises at least one pivotal connection enabling pivoting of the lever, causing the sliding the handle to the extended open position, when the lever is pivoted around the pivotal connection in response to an external force applied to the lever.

In one example, the apparatus comprises at least one stopper for stopping the handle into the extended open position.

In one example, the tray is structured to releasable receive at least two integrated circuit cards.

In one example, the apparatus comprises a locking mechanism enabling locking of the handle in the shortened closed position.

In one example, the handle comprises a through hole structured to receive an opening tool for applying an external force with the opening tool to the locking mechanism causing the unlocking of the locking mechanism.

In one example, the locking mechanism comprises a pair of wedge surfaces, a wedge and a latch and, wherein an external force applied to the wedge and to the latch via the wedge causes the latch to move out of an opening in the telescopic part enabling the handle to move to the extended open position.

In one example, the apparatus is a card tray module for an electronic communication device.

In one example, an electronic device comprises the apparatus.

In one example, the apparatus further comprises an electronic device, the electronic device comprising the tray, the handle, and the ejector.

An embodiment of an apparatus has a cover for holding at least one integrated circuit card inside the cover. The apparatus comprises a tray configured to carry at least one integrated circuit card; a handle connected to the tray in a slidable manner and having a shortened closed position and an extended open position with respect to the tray, wherein, in the extended open position, the handle extends outside the cover; and an ejector configured to eject the handle to its extended open position, while the tray remains in an unmoved position inside the cover.

In one example the cover comprises an opening for inserting and removing the tray, wherein the handle is structured to fit in the opening in the shortened closed position.

An embodiment of an apparatus comprises a tray configured to carry at least one integrated circuit card; a handle connected to the tray in a slidable manner and having a shortened closed position and an extended open position with respect to the tray; the handle comprising at least one telescopic part enabling sliding of the handle between the shortened closed position and the extended open position. The ejector is configured to eject the handle with the spring by releasing the spring from its compressed state effecting the movement of at least one telescopic part enabling the handle to move to the extended open position. In the extended open position, the handle extends away from the tray.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages.

Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification. In particular, the individual features, elements, or parts described in the context of one example may also be connected in any combination to any other example.

The invention claimed is:

1. An apparatus comprising a card tray module for an electronic communication device, the apparatus comprising: a tray configured to carry at least one integrated circuit card; a handle connected to the tray in a slidable manner and having a shortened closed position and an extended open position with respect to the tray; and an ejector configured to eject the handle to its extended open position, wherein, in the extended open position, the handle extends away from the tray; wherein, when the handle is ejected, the tray with the at least one integrated circuit card is not ejected.

2. The apparatus according to claim 1, wherein the ejector comprises a spring, which when released, causes the ejection of the handle to its extended open position.

3. The apparatus according to claim 2, wherein the spring is positioned between the tray and the handle in such a way that the handle is ejected to the extended open position, when the spring is released from its compressed state.

4. The apparatus according to claim 1, structured to releasably receive at least one of a subscriber identity module card, a secure digital card, a memory card, a storage card, and an expanded external memory card.

5. The apparatus according to claim 1, wherein the handle comprises at least one telescopic part enabling sliding of the handle between the shortened closed position and the extended open position.

6. The apparatus according to claim 5, wherein the tray comprises at least one guide rail, wherein the at least one guide rail is structured to receive the at least one telescopic part.

7. The apparatus according to claim 6, wherein the at least one guide rail comprises a first guide rail and a second guide rail at a distance from one another, wherein the tray is structured to receive the at least one integrated circuit card between the first guide rail and the second guide rail.

8. The apparatus according to claim 6, wherein the at least one telescopic part comprises a first inner end and the ejector comprises a spring.

9. The apparatus according to claim 5, wherein the ejector comprises a spring and a pushing member.

10. The apparatus according to claim 9, wherein the spring causes the pushing member to push the at least one telescopic part upon release of the spring from a compressed state, enabling the handle to move to the extended open position.

11. The apparatus according to claim 5, comprising a locking mechanism enabling locking of the handle in the shortened closed position.

12. The apparatus according to claim 11, wherein the handle comprises a through hole structured to receive an opening tool for applying an external force with the opening tool to the locking mechanism causing unlocking of the locking mechanism.

13. The apparatus according to claim 11, wherein the locking mechanism comprises a pair of wedge surfaces, a wedge and a latch and, wherein an external force applied to the wedge and to the latch via the wedge causes the latch to move out of an opening in the telescopic part enabling the handle to move to the extended open position.

14. The apparatus according to claim 1, comprising at least one lever, wherein the lever comprises at least one pivotal connection enabling pivoting of the lever, causing sliding of the handle to the extended open position, when the lever is pivoted around the pivotal connection in response to an external force applied to the lever.

15. The apparatus according to claim 1, comprising at least one stopper for stopping the handle into the extended open position.

16. The apparatus according to claim 1, wherein the tray is structured to releasably receive at least two integrated circuit cards.

17. The apparatus according to claim 1, further comprising an electronic device.

18. The apparatus according to claim 1, further comprising an electronic device, the electronic device comprising the tray, the handle, and the ejector.

19. An apparatus comprising a card tray module for an electronic communication device, the apparatus having a cover for holding at least one integrated circuit card inside the cover, the apparatus comprising: a tray configured to carry at least one integrated circuit card; a handle connected to the tray in a slidable manner and having a shortened closed position and an extended open position with respect to the tray, wherein, in the extended open position, the handle extends outside the cover; and an ejector configured to eject the handle to its extended open position, while the tray with the at least one integrated circuit card remains in an unmoved position inside the cover; wherein, when the handle is ejected, the tray with the at least one integrated circuit card is not ejected.

20. An apparatus comprising a card tray module for an electronic communication device, the apparatus comprising: a tray configured to carry at least one integrated circuit card; a handle connected to the tray in a slidable manner and having a shortened closed position and an extended open position with respect to the tray, the handle comprising at least one telescopic part enabling sliding of the handle between the shortened closed position and the extended open position; an ejector comprising a spring; and a locking mechanism, wherein the ejector is configured to eject the handle with the spring by releasing the spring from its compressed state affecting movement of at least one telescopic part enabling the handle to move to the extended open position; wherein, in the extended open position, the handle extends away from the tray; wherein, when the handle is ejected, the tray with the at least one integrated circuit card is not ejected.

* * * * *